US012805249B2

(12) United States Patent
Ahn et al.

(10) Patent No.: US 12,805,249 B2
(45) Date of Patent: Nov. 17, 2026

(54) TEMPERATURE CONTROLLER

(71) Applicant: SEMES CO., LTD., Cheonan-si (KR)

(72) Inventors: Dong Ok Ahn, Anyang-si (KR); Myeong Geun Lee, Hwaseong-si (KR); Sang Hyon Jeon, Cheonan-si (KR); Kyung Hun Jang, Jeonju-si (KR); Jeong Mo Hwang, Ansan-si (KR)

(73) Assignee: SEMES CO., LTD., Cheonan-si (KR)

( * ) Notice: Subject to any disclaimer, the term of this patent is extended or adjusted under 35 U.S.C. 154(b) by 938 days.

(21) Appl. No.: 18/069,634

(22) Filed: Dec. 21, 2022

(65) Prior Publication Data

US 2023/0215746 A1 Jul. 6, 2023

(30) Foreign Application Priority Data

Dec. 30, 2021 (KR) ........................ 10-2021-0192299
Aug. 31, 2022 (KR) ........................ 10-2022-0109706

(51) Int. Cl.
*H10P 72/00* (2026.01)
*G01K 7/14* (2006.01)
*G01K 15/00* (2006.01)

(52) U.S. Cl.
CPC ............ *H10P 72/0602* (2026.01); *G01K 7/14* (2013.01); *G01K 15/005* (2013.01)

(58) Field of Classification Search
CPC ........ G01K 15/005; G01K 7/021; G01K 7/14; G01K 7/20; H01L 21/67248
USPC .......................................................... 219/608
See application file for complete search history.

(56) References Cited

U.S. PATENT DOCUMENTS 5,228,114 A * 7/1993 Suzuki .............. H01L 21/67115 118/712
2008/0142500 A1* 6/2008 Tomita .............. H01L 21/67184 219/444.1
2009/0095422 A1* 4/2009 Sugishita .......... H01L 21/67109 118/708
2010/0039288 A1 2/2010 Mitchell et al.
2010/0285571 A1* 11/2010 Coursey ................. G01K 15/00 374/185

(Continued)

FOREIGN PATENT DOCUMENTS

CN 101750172 A 6/2010
CN 103542954 A 1/2014

(Continued)

OTHER PUBLICATIONS

Office Action for Korean Application No. 10-2022-0109706 dated Jan. 24, 2025.

(Continued)

*Primary Examiner* — Steven W Crabb
*Assistant Examiner* — Ket D Dang
(74) *Attorney, Agent, or Firm* — Harness, Dickey & Pierce, P.L.C.

(57) ABSTRACT

The inventive concepts provide a temperature controller for performing a comparative measurement process and a sensing calibration process without separating a temperature sensor and an input channel, if a comparative measurement process and a sensing calibration process of a temperature sensor for controlling a temperature of a semiconductor manufacturing facility are performed.

17 Claims, 6 Drawing Sheets

(56) References Cited

U.S. PATENT DOCUMENTS

| | | | | |
|---|---|---|---|---|
| 2013/0027015 A1* | 1/2013 | Park | G01K 7/20 323/285 |
| 2014/0072015 A1 | 3/2014 | Han et al. | |
| 2020/0033197 A1* | 1/2020 | Tamano | G01K 7/021 |
| 2022/0042855 A1* | 2/2022 | Yamashita | G01K 7/20 |

FOREIGN PATENT DOCUMENTS

| | | | |
|---|---|---|---|
| CN | 107436200 | A | 12/2017 |
| CN | 108646811 | A | 10/2018 |
| CN | 113503985 | A | 10/2021 |
| JP | 4321167 | B2 | 8/2009 |
| KR | 10-2004-0050724 | A | 6/2004 |
| KR | 101604947 | B1 | 3/2016 |
| KR | 10-2017-0092889 | A | 8/2017 |
| KR | 10-20200030283 | A | 3/2020 |
| KR | 2020-0135259 | A | 12/2020 |
| KR | 10-2493393 | B1 | 1/2023 |
| TW | 201230229 | A | 7/2012 |
| TW | 202100962 | A | 1/2021 |

OTHER PUBLICATIONS

Taiwanese Office Action dated Oct. 11, 2023, issued in Taiwanese Application No. 202110932347.X.

Office Action regarding Chinese Patent Application No. 202211730869.2, dated Dec. 30, 2025.

* cited by examiner

TEMPERATURE CONTROLLER

CROSS-REFERENCE TO RELATED APPLICATIONS

This application claims priority under 35 U.S.C. § 119 to Korean Patent Application No. 10-2021-0192299 filed on Dec. 30, 2021 and Korean Patent Application No. 10-2022-0109706 filed on Aug. 31, 2022, in the Korean Intellectual Property Office, the disclosures of which are incorporated by reference herein in their entireties.

BACKGROUND

Embodiments of the inventive concept described herein relate to a temperature controller.

In order to provide a constant temperature and humidity function or to satisfy the temperature conditions in the manufacturing process, a temperature controller that monitors the temperature is installed and operated in the semiconductor manufacturing facility.

Looking at a connection form with respect to an input part of a conventional temperature controller in detail, in the conventional temperature controller, a sensor input connector is electrically connected to the temperature controller while a temperature sensor is electrically connected to the sensor input connector.

In this case, the conventional temperature controller connects the temperature sensor to a measuring device to check whether the temperature sensor outputs a normal temperature value, and then performs a comparative measurement to measure the measured value of the temperature sensor.

In addition, since an output value of conventional temperature sensor changes slightly due to various factors when used for a long time, a sensing calibration process is performed to correct these changes with a calibrator.

However, in order to perform the comparative measurement work on the temperature sensor or to perform a sensing calibration process on the temperature sensor, an electrical connection between the temperature sensor installed in the semiconductor manufacturing facility and the sensor input connector of the input channel terminal must be disconnected.

Therefore, a conventional comparative measurement and a sensing calibration process requires the electrical connection between the temperature sensor and the sensor input connector to be linked to the semiconductor manufacturing facility, so there is a problem that the semiconductor manufacturing facility must be stopped.

In particular, after the comparative measurement and the sensing calibration, the electrical connection between the temperature sensor and the sensor input connector of the input terminal must be reconnected. At this time, depending on a temperature sensor type, a miswiring may occur, and unexpected operation mistakes may occur such as touching and disconnecting other wires during a process of connecting close electrical connections of the temperature sensor, or causing an electrical contact error due to an impact on other components.

PRIOR ART REFERENCE

Korean Patent Publication No. 10-2020-0135259 (published on Dec. 2, 2020)

SUMMARY

Embodiments of the inventive concept provide a temperature controller for performing a comparative measurement process and a sensing calibration process without separating a temperature sensor and an input channel, if a comparative measurement process and a sensing calibration process of a temperature sensor for controlling a temperature of a semiconductor manufacturing facility are performed.

The technical objectives of the inventive concept are not limited to the above-mentioned ones, and the other unmentioned technical objects will become apparent to those skilled in the art from the following description.

The inventive concept provides a temperature controller. The temperature controller includes a temperature sensor unit installed within a semiconductor manufacturing facility and configured to detect a temperature value; a signal control unit configured to be electrically connected to the temperature sensor unit and to input the temperature value; and a measuring device to input the temperature value to measure if electrically connected with the temperature sensor unit, and wherein the signal control unit electrically connects the temperature sensor unit and the measuring device while inner switches are turned on, and the temperature value detected by the temperature sensor unit is transmitted to the measuring device.

In an embodiment, the temperature sensor unit is a thermocouple temperature sensor.

In an embodiment, the temperature controller further includes: a converter unit configured to be electrically connected to the signal control unit and to digitally convert the temperature value; and a temperature control unit configured to be electrically connected to the converter unit and to generate a control driving with respect to a temperature within the semiconductor manufacturing facility by being input with a digitally converted temperature value.

In an embodiment, the temperature controller further includes an input connector providing an electrically combined region between the temperature sensor unit and the signal control unit.

In an embodiment, the input connecter includes: an input side connector body which combines with a periphery of the semiconductor manufacturing facility; and an input side coupling terminal unit which is screwed to the input side connector body to electrically and mechanically connect the signal control unit and an output terminal of the temperature sensor unit.

In an embodiment, the temperature controller further includes a branch connecter providing an electrically combined region between the signal control unit and the measuring device.

In an embodiment, the branch connecter includes: a branch side connector body which combines with a periphery of the semiconductor manufacturing facility; and a branch input side coupling terminal unit which is screwed to the branch side connector body to electrically and mechanically connect the measuring device and an input terminal of the signal control unit.

In an embodiment, the temperature control unit is electrically connected to a heating apparatus used at the converter unit and the semiconductor manufacturing facility, is input with the temperature value measured by the temperature sensor unit from the converter unit, and controls a temperature of the heating apparatus so the measured temperature value follows a set temperature value.

The inventive concept provides a temperature controller. The temperature controller includes a temperature sensor unit installed within a semiconductor manufacturing facility and configured to detect a temperature value; a signal control unit configured to be electrically connected to the temperature sensor unit and to input the temperature value;

and a measuring device to input the temperature value to measure if electrically connected with the temperature sensor unit, and wherein the signal control unit turns on inner switches connected to the measuring device, while the inner switches connected to the signal control unit among the inner switches are turned off.

In an embodiment, the temperature sensor unit is a resistance temperature detector (RTD) temperature sensor.

In an embodiment, the temperature controller further includes: a converter unit configured to be electrically connected to the signal control unit and to digitally convert the temperature value; and a temperature control unit configured to be electrically connected to the converter unit and to generate a control driving with respect to a temperature within the semiconductor manufacturing facility by being input with a digitally converted temperature value.

In an embodiment, the temperature controller further includes an input connector providing an electrically combined region between the temperature sensor unit and the signal control unit.

In an embodiment, the temperature controller further includes a branch connecter providing an electrically combined region between the signal control unit and the measuring device.

In an embodiment, the temperature controller further includes a signal operation unit configured to electrically connect to the signal control unit and to selectively maintain the inner switches of the signal control unit in a turn-on state or a turn-off state by inputting a switching command to the signal control unit.

In an embodiment, the signal control unit is configured as an analog multiplexer.

In an embodiment, the signal control unit turns-off switches connected to the temperature sensor unit among inner switches while the measuring device is connected, so a temperature value of the temperature sensor unit is not transmitted to the converter unit.

In an embodiment, the temperature controller further includes a buffer unit configured to be electrically connected between the converter unit and the temperature control unit, to store the temperature value output from the converter unit, and to continuously transmit a stored temperature value to the temperature control unit.

In an embodiment, the temperature controller further includes a sensor power source unit configured to electrically connect to a portion of the inner switches of the signal control unit to supply a power to the temperature sensor unit.

In an embodiment, the temperature control unit is electrically connected to a heating apparatus used in the converter unit and the semiconductor manufacture facility, is input with a temperature value measured by the temperature sensor unit from the converter unit, and which controls a temperature of the heating apparatus so the measured temperature value follows a set temperature value.

The inventive concept provides a temperature controller. The temperature controller includes a temperature sensor unit installed within a semiconductor manufacturing facility to detect a temperature value, and configured as a thermocouple temperature sensor or a resistance temperature detector temperature sensor; a signal control unit configured to be electrically connected to the temperature sensor unit and to input the temperature value; and a measuring device to input the temperature value to measure if electrically connected with the temperature sensor unit, and wherein the signal control unit electrically connects the temperature sensor unit and the measuring device in a turned-on state of the inner switches to transfer the temperature value detected by the temperature sensor unit to the measuring device, if the temperature sensor unit is configured as a thermocouple temperature sensor, and the signal control unit turns on inner switches connected to the measuring device, in a state at which inner switches connected to the signal control unit among the inner switches are turned off, if the temperature sensor unit is configured as a resistance temperature detector temperature sensor.

According to an embodiment of the inventive concept, a comparative measurement process and a sensing calibration process may be performed without separating a temperature sensor and an input channel, if the comparative measurement process and the sensing calibration process is performed for a temperature control of a semiconductor manufacturing facility.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
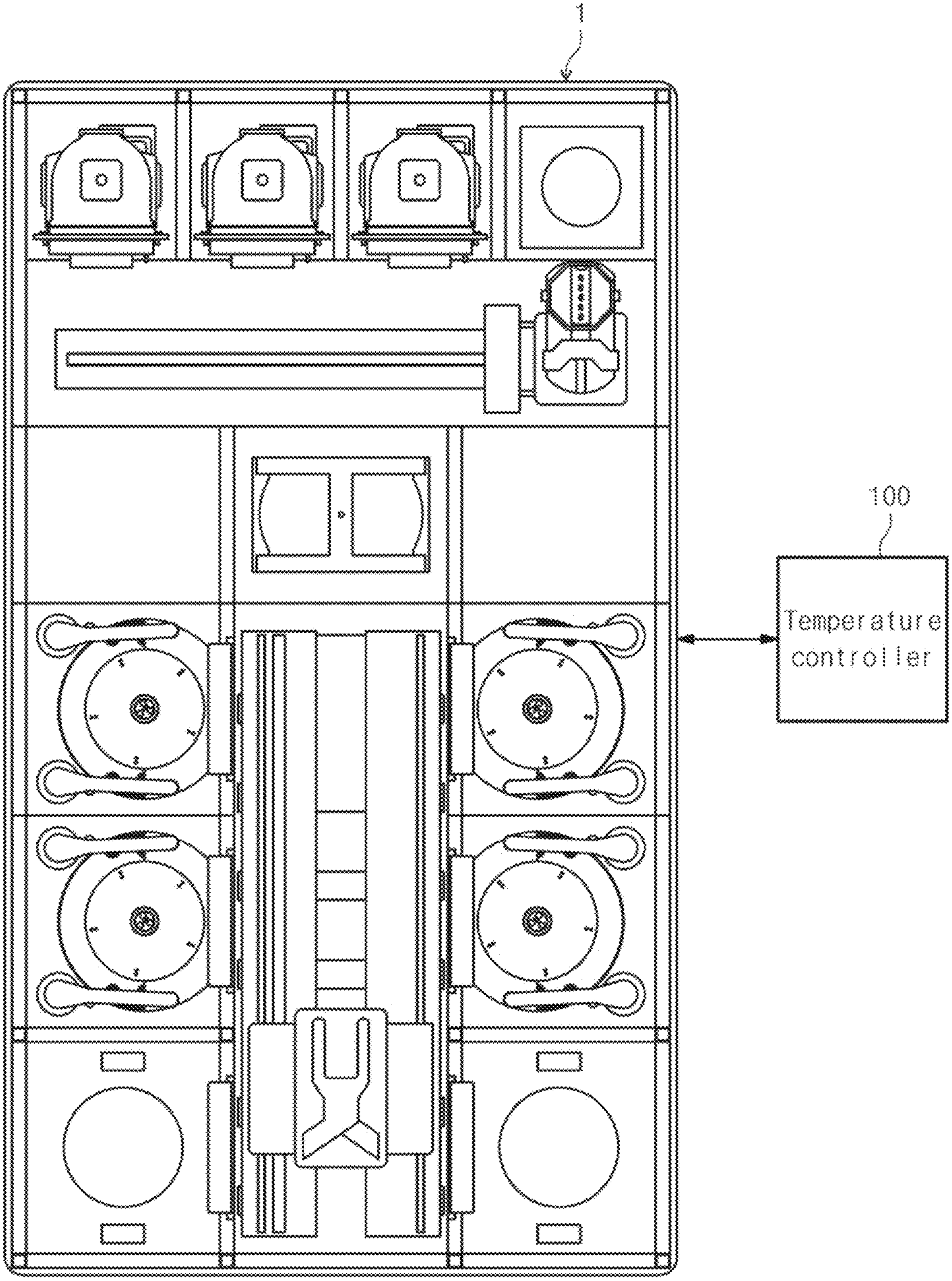
FIG. 1 is a plan view of a semiconductor manufacturing facility using a temperature controller according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms “a”, “an” and “the” are intended to include the plural forms as well, unless the context clearly indicates otherwise. It will be further understood that the terms “comprises” and/or “comprising,” when used in this specification, specify the presence of stated features, integers, steps, operations, elements, and/or components, but do not preclude the presence or addition of one or more other features, integers, steps, operations, elements, components, and/or groups thereof. As used herein, the term “and/or” includes any and all combinations of one or more of the associated listed items. Also, the term “exemplary” is intended to refer to an example or illustration.

It will be understood that, although the terms “first”, “second”, “third”, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, embodiments of the inventive concept will be described in detail with reference to the accompanying drawings.

Figure 2:
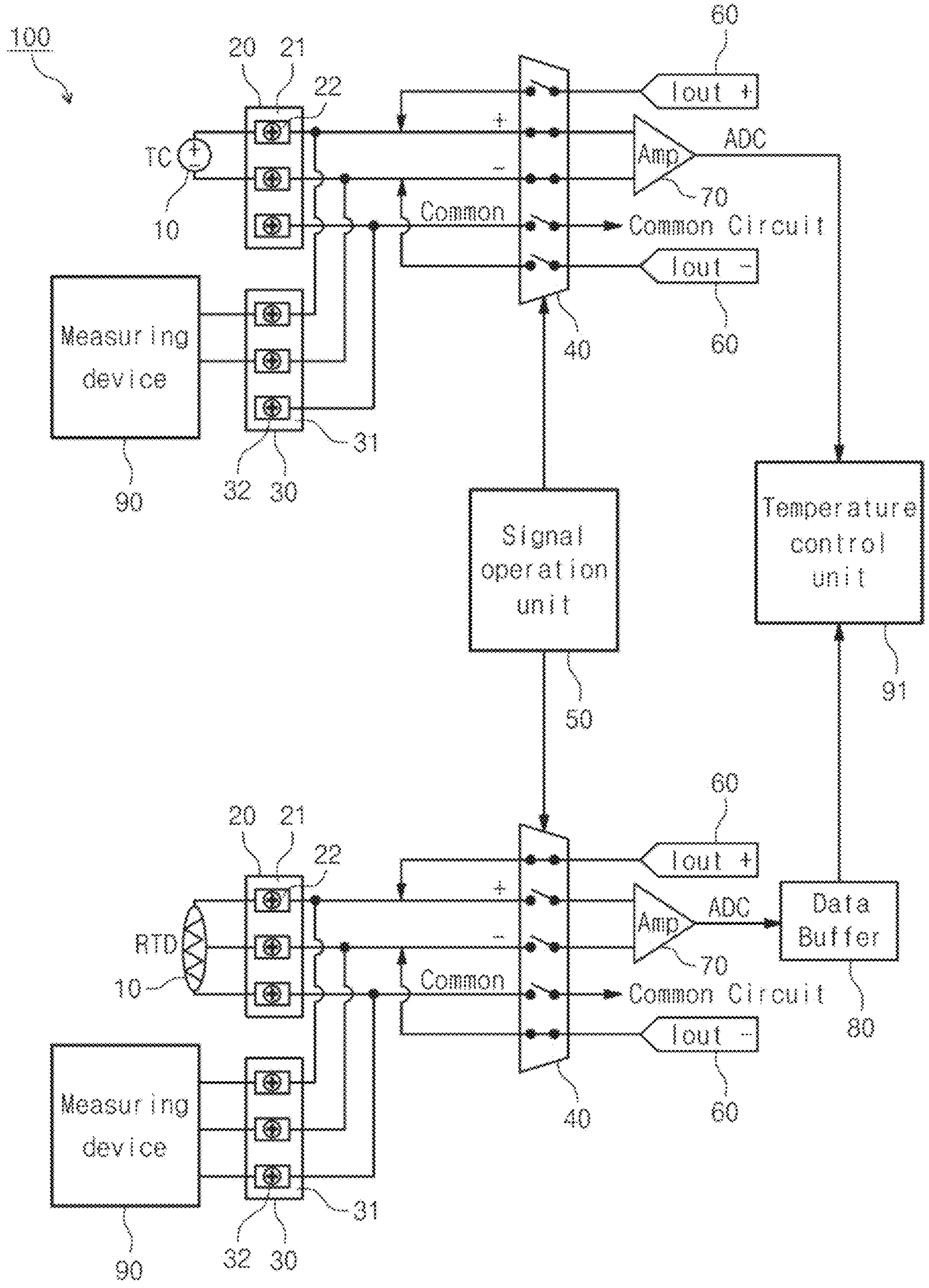
FIG. 2 is a block view of the temperature controller according to an embodiment of the inventive concept.
Figure 3:
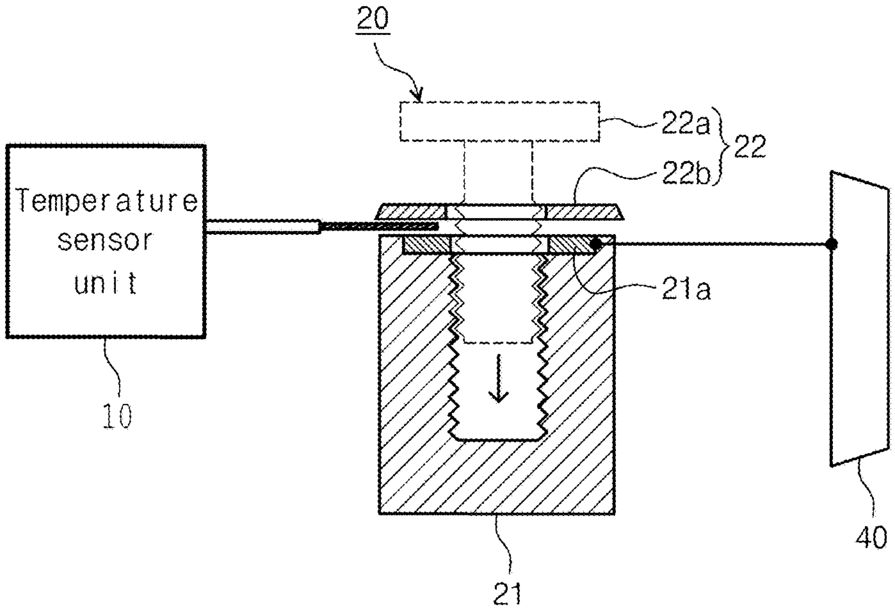
FIG. 3 is a detailed view of a coupling state of an input connector illustrated in FIG. 2.
Figure 4:
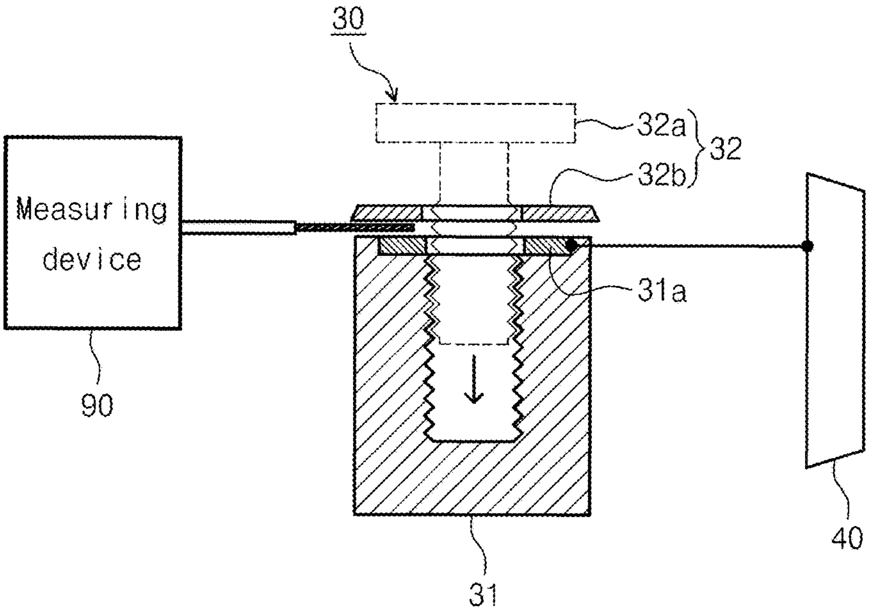
FIG. 4 is a detailed view of a coupled state of a branch connector illustrated in FIG. 2.

FIG. 1 is a plan view of a base treating apparatus among a semiconductor manufacturing facility using a temperature controller according to an embodiment of the inventive concept. FIG. 2 is a block view of a temperature controller according to an embodiment of the inventive concept. FIG. 3 is a detailed view illustrating a coupling state of an input connector shown in FIG. 2. FIG. 4 is a detailed view illustrating a coupled state of a branch connector shown in FIG. 2.

As shown in FIG. 1 to FIG. 4, a temperature controller 100 according to an embodiment of the inventive concept includes a temperature sensor unit 10, an input connector 20, a branch connector 30, a signal control unit 40, a signal operation unit 50, a sensor power supply unit 60, a converter unit 70, a buffer unit 80, a measuring device 90 and a temperature control unit 91.

The temperature sensor unit 10 is composed of a thermocouple TC temperature sensor or a resistance temperature detector RTD temperature sensor. FIG. 2 illustrates both a case in which the temperature sensor unit 10 is configured as a thermocouple temperature sensor and a case in which the temperature sensor unit 10 is configured as a resistance temperature detector. The temperature sensor unit 10 is installed in the semiconductor manufacturing facility 1 to detect a temperature in the semiconductor manufacturing facility 1. In this case, if the temperature sensor unit 10 is configured as a thermocouple temperature sensor, a temperature value is measured through two output terminals for a + voltage terminal and a − voltage terminal. In addition, if the temperature sensor unit 10 is composed of a temperature resistor temperature sensor, the temperature value is measured through three output terminals for the + current terminal, the − current terminal, and the ground terminal (Common).

The input connector 20 electrically connects the temperature sensor unit 10 and the signal control unit 40.

In the inventive concept, the input connector 20 includes an input side connector body 21 and an input side coupling terminal unit 22.

The input side connector body 21 is coupled to a semiconductor manufacturing facility 1 or a peripheral facility. In addition, the input side connector body 21 further has a first contact terminal **21*a* for a multiplexing connection outside the main body, and in this case, the first contact terminal 21*a* for the multiplexing connection is electrically connected to the signal control unit 40**.

The input-side connector body 21 is coupled near a container of the semiconductor manufacturing facility 1 to prevent a flow by an outer force, thereby ensuring a coupling safety.

The input side coupling terminal unit 22 includes an input side coupling bolt **22*a* and an input side contact terminal 22*b*. The input side coupling bolt 22*a* is screw-coupled to the input side connector body 21. The input side contact terminal 22*b* electrically connects the signal control unit 40 and an output terminal of the temperature sensor unit 10. More specifically, the input side coupling terminal unit 22 is pressured when the input side coupling bolt 22*a* is screwed in contact with the output terminals of the temperature sensor unit 10 to then pressure the output terminals of the temperature sensor unit 10 to the multiplex connection first contact terminal 21*a* to be combined while maintaining an electrical connection. Therefore, the output terminal of the temperature sensor unit 10 is strongly coupled by the input side coupling terminal unit 22, so that the electrical coupling is not easily released by an outer force. In addition, when installing and replacing the temperature sensor unit 10, the input side coupling bolt 22*a* and the input side connector body 21 are unscrewed, so that the electrical coupling between the output terminal of the temperature sensor unit 10 and the temperature controller 100** can be easily released.

The branch connector 30 electrically connects the signal control unit 40 and the measuring device 90.

In the inventive concept, the branch connector 30 includes a branch-side connector body 31 and a branch-side coupling terminal 32.

The branch-side connector body 31 is coupled to a semiconductor manufacturing facility 1 or a peripheral facility. In addition, the branch-side connector body 31 further has a second contact terminal **31*a* for a multiplexing connection outside the main body, and in this case, the second contact terminal 31*a* for the multiplexing connection is electrically connected to the signal control unit 40**.

The branch-side connector body 31 is coupled near the container of the semiconductor manufacturing facility 1 to prevent a flow by an outer force, thereby ensuring a coupling safety.

The branch side coupling terminal unit 32 includes a branch side coupling bolt **32*a* and a branch side contact terminal 32*b*. The branch side coupling bolt 32*a* is screw-coupled to the branch side connector body 31. The branch-side contact terminal 32*b* electrically connects the measuring device 90 and the input terminal of the signal control unit 40. More specifically, the branch side coupling terminal unit 32 is pressured when the branch side coupling bolt 32*a* is screwed in contact with the input terminals of the measuring device 90 to then pressure the multiplex connection first contact terminal 21*a* to be combined while maintaining an electrical connection H. Therefore, when measuring the temperature sensor unit 10, the input terminal of the measuring device 90 is strongly coupled by the branch side coupling terminal unit 32, so that the electrical coupling is not easily released by an outer force. In addition, when the measurement of the temperature sensor unit 10 is not required, the electrical coupling between the input terminal of the measuring device 90** and the temperature controller

100 can be easily released by unscrewing the branch-side coupling bolt 32*a* and the branch-side connector body 31.

The signal control unit 40 is electrically connected to the input connector 20, receives a temperature value from the temperature sensor unit 10, and transmits the received temperature value to the converter unit 70.

In this embodiment, the signal control unit 40 is configured as an analog multiplexer, and thus the temperature value input from the temperature sensor unit 10 may be transmitted to the converter unit 70 for all cases in which the temperature sensor unit 10 is configured as a thermocouple temperature sensor or a resistance temperature detector temperature sensor. In addition, the signal control unit 40 composed of the analog multiplexer is electrically connected to the signal operation unit 50. In this case, if the signal operation unit 50 connects the measuring device 90 to measure the temperature sensor unit 10, it receives switching commands according to a switching command value, and selectively switches on and off each of the inner switches of the analog multiplexer. In this case, the inner switches of the analog multiplexer electrically connected to the temperature sensor unit 10 allow the temperature value detected by the temperature sensor unit 10 to be transmitted to the converter unit 70 if a turn-on state is maintained. In addition, the inner switches of the analog multiplexer electrically connected to the temperature sensor unit 10 do not transmit the temperature value detected by the temperature sensor unit 10 to the converter unit 70 if the turn-off state is maintained.

The signal operation unit 50 is electrically connected to the signal control unit 40. As described above, the signal operation unit 50 selectively switches each of the inner switches of the signal control unit 40 composed of an analog multiplexer according to the switching command to maintain each of the inner switches in a turned-on state or a turned-off state. Here, the switching command set in the signal operation unit 50 may be set by a program command linked to the temperature control unit 91, or may be set by using a separate control device which controls each of the inner switches of each analog multiplexer. When the measuring device 90 is connected to measure the temperature value of the resistance temperature detector temperature sensor, the signal operation unit 50 generates a switching command in the signal control unit 40 to selectively switch inner switches to a turn-on or turn-off state to form a state in which the measuring device 90 can receive a signal and measure. In addition, in the case of a thermocouple temperature sensor, the signal control unit 50 maintains the inner switches turned on, so that the temperature value of the temperature sensor unit 10 is supplied to both the signal control unit 40 and the measuring device 90.

The sensor power supply unit 60 is a power supply device which supplies a power to the temperature sensor unit 10, and is electrically connected to some of the inner switches of the signal control unit 40 composed of analog multiplexers. In this case, the sensor power supply unit 60 supplies the power to the temperature sensor unit 10 through an analog multiplexer. In addition, if the temperature sensor unit 10 is composed of a thermocouple temperature sensor, it does not receive the power from the sensor power supply unit 60, but only if the temperature sensor unit 10 is composed of a resistance temperature detector temperature sensor.

The converter unit 70 is electrically connected between the signal control unit 40 and the temperature control unit 91. The converter unit 70 converts the analog temperature value input to the signal control unit 40 into a digital temperature value.

If the temperature sensor unit 10 is configured as a resistance temperature detector temperature sensor, the buffer unit 80 is electrically connected between the converter unit 70 and the temperature control unit 91. If the temperature sensor unit 10 is configured as a temperature resistor temperature sensor, the buffer unit 80 stores the temperature value output from the converter unit 70 and continuously transmits the previously stored temperature value to the temperature control unit 91 even when some of the inner switches are turned off.

The measuring device 90 is a device which measures the temperature value detected by the temperature sensor unit 10 and displays the temperature measurement value to be shown to the measuring operator. Such a measuring device 90 is used by being electrically connected to the branch connector 30 if the temperature sensor unit 10 wants to detect the measured analog temperature value.

The temperature control unit 91 is electrically connected to the converter unit 70 and a heating device (not shown) used in the semiconductor manufacturing facility 1. The temperature control unit 91 receives the temperature value measured by the temperature sensor unit 10 from the converter unit 70, and controls the temperature of the heating device in the semiconductor manufacturing facility 1 so that the measured temperature value follows a set temperature value.

Hereinafter, a measuring method of measuring the temperature sensor unit 10 of the temperature controller 100 as described above will be described, and each case of <If the temperature sensor unit 10 is configured as a thermocouple TC temperature sensor> and <If the temperature sensor unit 10 is configured as a temperature resistor RTD temperature sensor>.

<If the Temperature Sensor Unit 10 is Configured as a Thermocouple Temperature Sensor>

Figure 5:
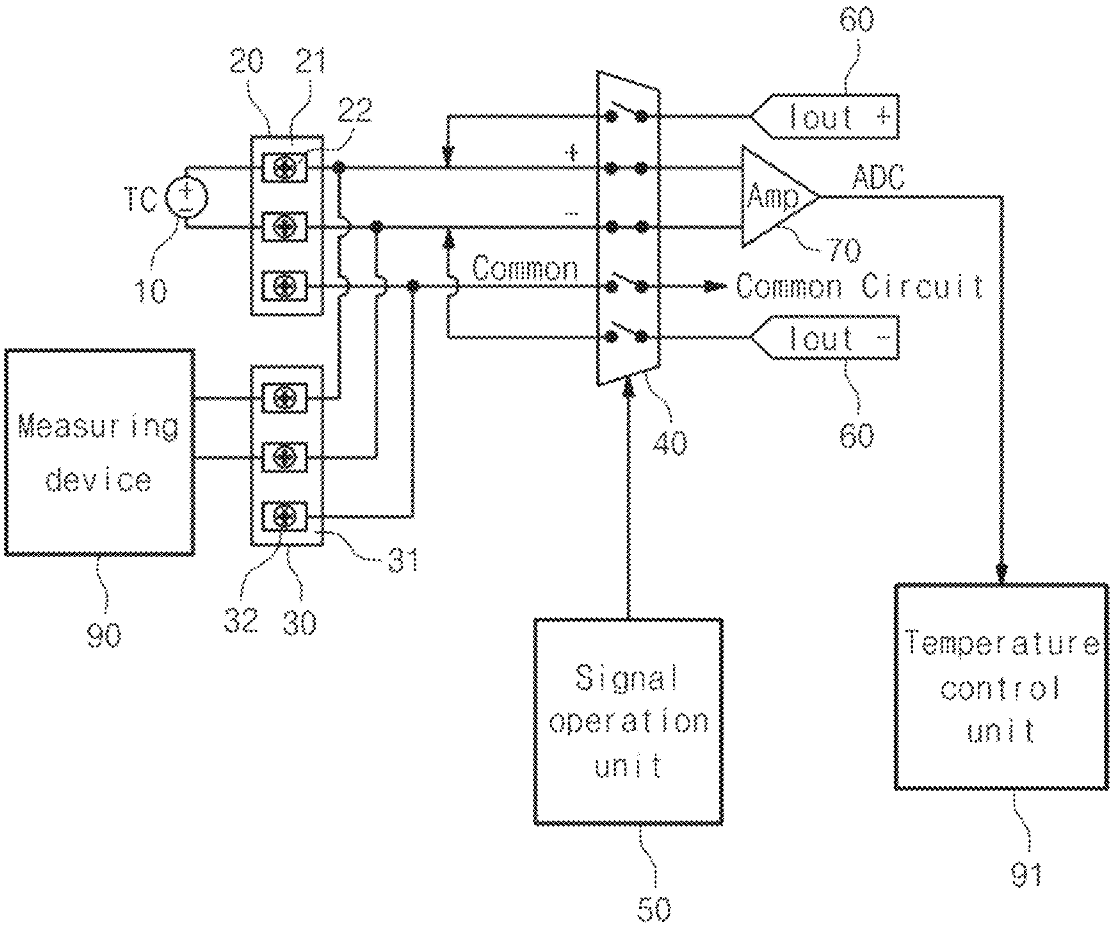
FIG. 5 is a block view of a state in which a temperature value of a temperature sensor unit is detected by a measuring device if the temperature sensor unit is configured as a thermocouple temperature sensor.

FIG. 5 is a block view of a state in which a temperature value of the temperature sensor unit 10 is detected by the measuring device 90 if the temperature sensor unit 10 is configured as a thermocouple temperature sensor.

As shown in FIG. 5, if the temperature sensor unit 10 is configured as a thermocouple temperature sensor, the operator connects the measuring device 90 to the branch connector 30 and checks the analog temperature value of the temperature sensor unit 10 displayed on the measuring device 90. In this case, the signal control unit 40 maintains the inner switch in a turned-on state in both the thermocouple temperature sensor and the measuring device 90.

Next, the operator compares the temperature value displayed on the measuring device 90 with the temperature value output from the temperature control unit 91, and corrects the temperature control unit 91, which is a thermocouple temperature sensor, if an error occurs.

In this way, the temperature controller 100 according to an embodiment of the inventive concept can perform a comparative measurement and a sensing calibration without separating the temperature sensor unit 10 and the input channel, so that the semiconductor manufacturing facility 1 can be operated without an interruption.

<If the Temperature Sensor Unit 10 is Configured as a Temperature Resistor Temperature Sensor>

Figure 6:
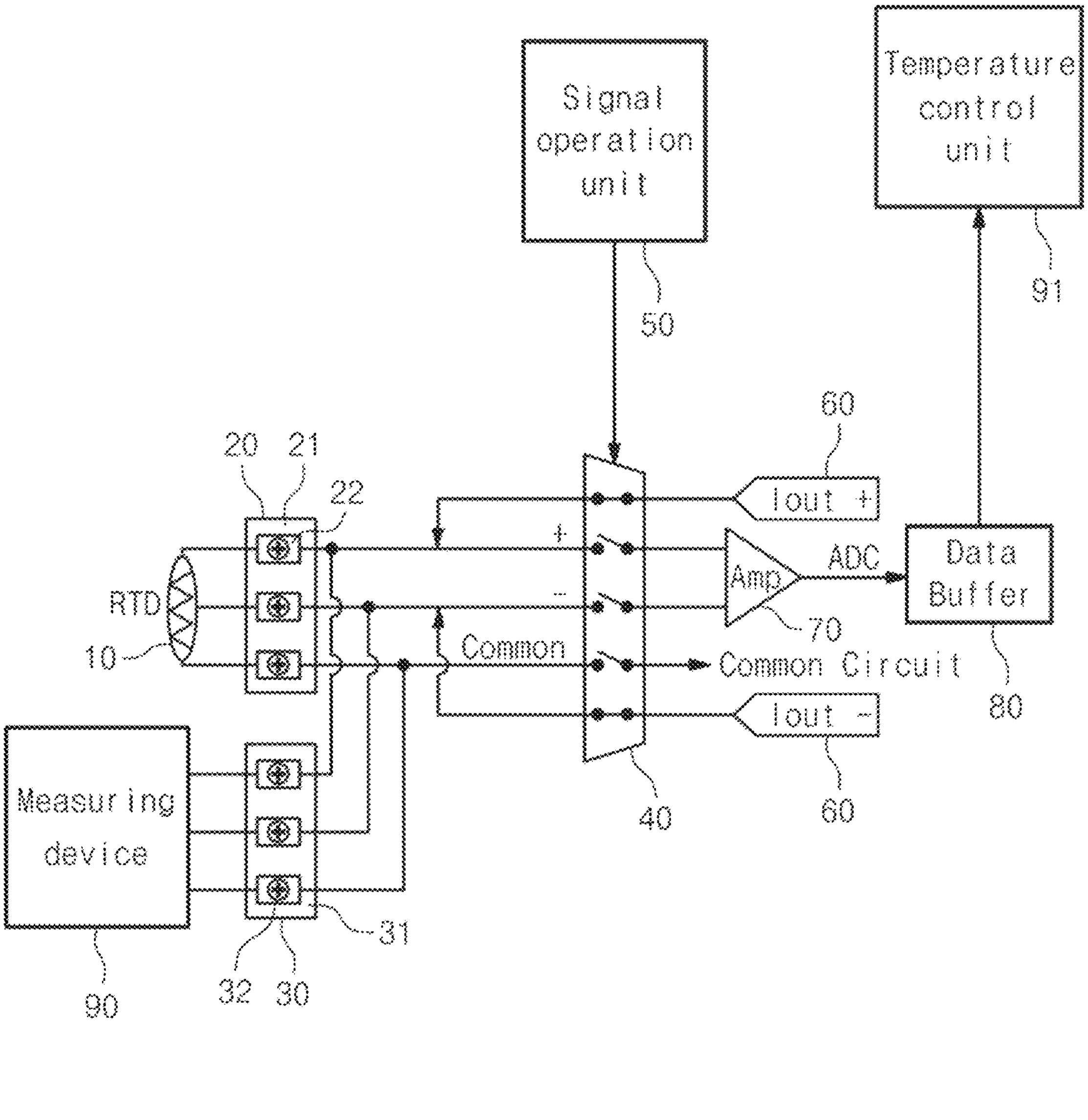
FIG. 6 is a block view of a state in which the temperature value of the temperature sensor unit is transmitted to the measuring device by controlling a signal control unit if the temperature sensor unit is configured as a temperature resistor temperature sensor.
Figure 7:
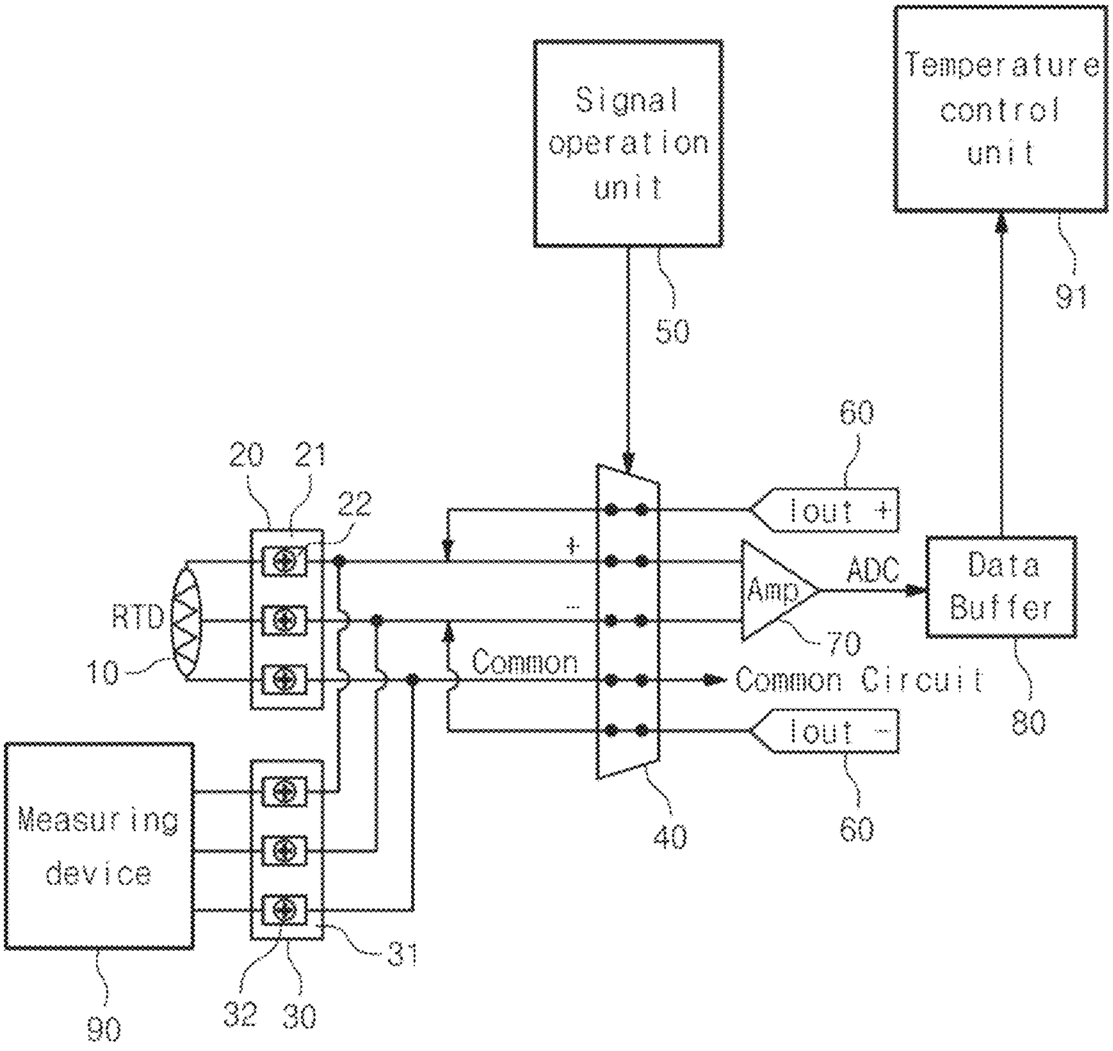
FIG. 7 is a block view of a state in which the measuring device illustrated in FIG. 6 is removed and the signal control unit is controlled so that the temperature value of the temperature sensor unit is transmitted to the temperature control unit.

FIG. 6 is a block view of a state in which the temperature value of the temperature sensor unit 10 is transmitted to the measuring device 90 by controlling the signal control unit 40 if the temperature sensor unit 10 is configured as a temperature resistor temperature sensor. FIG. 7 is a block view of a state in which the measuring device 90 illustrated in FIG. 6 is removed and the signal control unit 40 is controlled so that the temperature value of the temperature sensor unit 10 is transmitted to the temperature control unit 91.

As illustrated in FIG. 6, if the temperature sensor unit 10 is configured as a temperature resistor temperature sensor, the operator connects the measuring device 90 to the branch connector 30 and checks the analog temperature value of the temperature sensor unit 10 displayed on the measuring device 90.

At this time, the measurement operator drives the signal operation unit 50, specifically, among the inner switches of the signal control unit 40, turns on the inner switch of the sensor power supply unit 60 to supply the power to the resistance temperature detector temperature sensor, and turns off the remaining inner switches to prevent the temperature value of the resistance temperature detector from being transmitted to the converter unit 70.

Next, the measurement operator compares the temperature value displayed on the measuring device 90 with the temperature value output to the temperature control unit 91, and corrects the temperature control unit 91, which is a temperature resistor temperature sensor, when an error occurs.

At this time, the buffer unit 80 stores the temperature value finally output from the converter unit 70, and the temperature control unit 91 continuously receives the temperature value stored in the buffer unit 80 and continuously performs a temperature control driving. Therefore, the temperature controller drives the temperature control to the pre-stored temperature value even when the temperature sensor unit 10 is measured, so that the operation of the semiconductor manufacturing facility 1 is not interrupted.

Next, after completing the measurement work, the measurement operator disconnects the measuring device 90 and the branch connector 30 as illustrated in FIG. 7, and turns on the inner switches of the signal control unit 40 in a turn-on state by driving the signal operation unit 50.

Then, the temperature sensor unit 10 transmits the detected temperature value to the signal control unit 40 while receiving the power from the sensor power supply unit 60, the transmitted temperature value is converted into a digital temperature value by the converter unit 70, and the converted digital temperature value is transmitted to the temperature control unit 91 of the semiconductor manufacturing facility 1 through the converter unit 70.

In this way, the temperature controller 100 according to an embodiment of the inventive concept can perform a comparative measurement and a sensing calibration without separating the temperature sensor unit 10 and the input channel when performing a comparative measurement and a sensing calibration of the temperature sensor unit 10 which is a resistance temperature detector.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A temperature controller comprising:

a temperature sensor unit installed within a semiconductor manufacturing facility and configured to detect a temperature value;

a signal control unit including inner switches configured to be electrically connected to the temperature sensor unit and to input the temperature value; and a measuring device to input the temperature value to measure in response to electrically connecting with the temperature sensor unit, an input connector providing an electrically combined region between the temperature sensor unit and the signal control unit, wherein the input connector includes an input side connector body that combines with a periphery of the semiconductor manufacturing facility, and an input side coupling terminal unit that is screwed to the input side connector body to electrically and mechanically connect the signal control unit and an output terminal of the temperature sensor unit, wherein the signal control unit electrically connects the temperature sensor unit and the measuring device in response to the inner switches being turned on, and the temperature value detected by the temperature sensor unit is transmitted to the measuring device.

2. The temperature controller of claim 1, wherein the temperature sensor unit is a thermocouple temperature sensor.

3. The temperature controller of claim 1 further comprising:

a converter unit configured to be electrically connected to the signal control unit and to digitally convert the temperature value; and a temperature control unit configured to be electrically connected to the converter unit and to generate a control driving with respect to a temperature within the semiconductor manufacturing facility by being input with a digitally converted temperature value.

4. The temperature controller of claim 3, wherein the temperature control unit is electrically connected to a heating apparatus used at the converter unit and the semiconductor manufacturing facility, is input with the temperature value measured by the temperature sensor unit from the converter unit, and controls a temperature of the heating apparatus so the measured temperature value follows a set temperature value.

5. The temperature controller of claim 1 further comprising a branch connecter providing an electrically combined region between the signal control unit and the measuring device.

6. The temperature controller of claim 5, wherein the branch connecter comprises:

a branch side connector body that combines with a periphery of the semiconductor manufacturing facility; and a branch input side coupling terminal unit screwed to the branch side connector body to electrically and mechanically connect the measuring device and an input terminal of the signal control unit.

7. A temperature controller comprising:

a temperature sensor unit installed within a semiconductor manufacturing facility and configured to detect a temperature value;

a signal control unit configured to be electrically connected to the temperature sensor unit and to input the temperature value; and a measuring device to input the temperature value configured to measure in response to electrically connecting with the temperature sensor unit, an input connector providing an electrically combined region between the temperature sensor unit and the signal control unit, the input connector including an input connector body including an internally threaded bore, an input side coupling terminal threadedly connected to the input connector body, and an input side contact terminal secured to the input side coupling terminal and electrically connected to the temperature control unit and the signal control unit, and wherein the signal control unit turns on inner switches connected to the measuring device, while the inner switches connected to the signal control unit among the inner switches are turned off.

8. The temperature controller of claim 7, wherein the temperature sensor unit is a resistance temperature detector (RTD) temperature sensor.

9. The temperature controller of claim 7 further comprising:

a converter unit configured to be electrically connected to the signal control unit and to digitally convert the temperature value; and a temperature control unit configured to be electrically connected to the converter unit and to generate a control driving with respect to a temperature within the semiconductor manufacturing facility by being input with a digitally converted temperature value.

10. The temperature controller of claim 9 further comprising a signal operation unit configured to electrically connect to the signal control unit and to selectively maintain the inner switches of the signal control unit in a turn-on state or a turn-off state by inputting a switching command to the signal control unit.

11. The temperature controller of claim 10, wherein the signal control unit is configured as an analog multiplexer.

12. The temperature controller of claim 11, wherein the signal control unit turns-off switches connected to the temperature sensor unit among inner switches while the measuring device is connected, so a temperature value of the temperature sensor unit is not transmitted to the converter unit.

13. The temperature controller of claim 11 further comprising a buffer unit configured to be electrically connected between the converter unit and the temperature control unit, to store the temperature value output from the converter unit, and to continuously transmit a stored temperature value to the temperature control unit.

14. The temperature controller of claim 7 further comprising a branch connecter providing an electrically combined region between the signal control unit and the measuring device.

15. The temperature controller of claim 7 further comprising a sensor power source unit configured to electrically connect to a portion of the inner switches of the signal control unit to supply a power to the temperature sensor unit.

16. The temperature controller of claim 9, wherein the temperature control unit is electrically connected to a heating apparatus used in the converter unit and the semiconductor manufacturing facility, is input with a temperature value measured by the temperature sensor unit from the converter unit, and controls a temperature of the heating apparatus so the measured temperature value follows a set temperature value.

17. A temperature controller comprising:

a temperature sensor unit installed within a semiconductor manufacturing facility to detect a temperature value, and configured as a thermocouple temperature sensor or a resistance temperature detector temperature sensor;

a signal control unit including inner switches configured to be electrically connected to the temperature sensor unit and to input the temperature value; and a measuring device to input the temperature value configured to measure in response to electrically connecting with the temperature sensor unit, and wherein the signal control unit electrically connects the temperature sensor unit and the measuring device in a turned-on state of the inner switches to transfer the temperature value detected by the temperature sensor unit to the measuring device, if the temperature sensor unit is configured as a thermocouple temperature sensor, an input connector providing an electrically combined region between the temperature sensor unit and the signal control unit, the input connector including an input connector body including an internally threaded bore, an input side coupling terminal threadedly connected to the input connector body, and the signal control unit turns on inner switches connected to the measuring device, in a state at that inner switches connected to the signal control unit among the inner switches are turned off, if the temperature sensor unit is configured as a resistance temperature detector temperature sensor.

* * * * *